(12) United States Patent
Lin et al.

(10) Patent No.: US 8,900,374 B2
(45) Date of Patent: Dec. 2, 2014

(54) METHOD FOR SUBSTRATE CLEANING INCLUDING MOVEMENT OF SUBSTRATE BELOW SUBSTRATE CLEANING MODULE

(75) Inventors: Cheng-Yu (Sean) Lin, Sunnyvale, CA (US); Mark Kawaguchi, Sunnyvale, CA (US); Mark Wilcoxson, Oakland, CA (US); Russell Martin, Livermore, CA (US); Leon Ginzburg, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 326 days.

(21) Appl. No.: 12/942,446

(22) Filed: Nov. 9, 2010

(65) Prior Publication Data

US 2011/0048467 A1 Mar. 3, 2011

Related U.S. Application Data

(63) Continuation of application No. 12/431,731, filed on Apr. 28, 2009, now Pat. No. 7,849,554.

(51) Int. Cl.
*B08B 3/04* (2006.01)
*H01L 21/67* (2006.01)

(52) U.S. Cl.
CPC ....... *H01L 21/67051* (2013.01); *Y10S 134/902* (2013.01)
USPC ................... 134/34; 134/15; 134/21; 134/26; 134/902

(58) Field of Classification Search
CPC ............................................... H01L 21/67051
USPC ................... 134/15, 26, 34, 902, 21
See application file for complete search history.

(56) References Cited

U.S. PATENT DOCUMENTS

| 7,329,321 | B2 * | 2/2008 | Yun et al. .................. 134/15 |
| 2002/0081118 | A1 | 6/2002 | Sakurai et al. |
| 2004/0079387 | A1 | 4/2004 | Mori |
| 2004/0106072 | A1 | 6/2004 | Itoh et al. |

FOREIGN PATENT DOCUMENTS

| JP | 2002252167 | 9/2002 |
| JP | 2003151948 | 5/2003 |
| JP | 2003266030 | 9/2003 |
| JP | 2004095712 | 3/2004 |
| JP | 2004221244 | 8/2004 |
| JP | 2006049858 | 2/2006 |
| WO | WO2008065809 | 6/2008 |

\* cited by examiner

*Primary Examiner* — Michael Kornakov
*Assistant Examiner* — Douglas Lee
(74) *Attorney, Agent, or Firm* — Martine Penilla Group, LLP

(57) ABSTRACT

A substrate is moved below a substrate cleaning module in a direction extending from a leading edge to a trailing edge of the substrate cleaning module. A cleaning material is dispensed downward toward a top surface of the substrate along the leading edge of the substrate cleaning module. A rinsing material is dispensed downward toward the top surface of the substrate along the trailing edge of the substrate cleaning module to generate a rinsing meniscus. Vacuum suction is applied at a vacuum suction location along a bottom surface of the substrate cleaning module and parallel to the leading and trailing edges of the substrate cleaning module. The vacuum location is positioned between a dispense location of the cleaning material and a dispense location of the rinsing material. A plenum region located between the dispense location of the cleaning material and the vacuum location is vented.

16 Claims, 8 Drawing Sheets

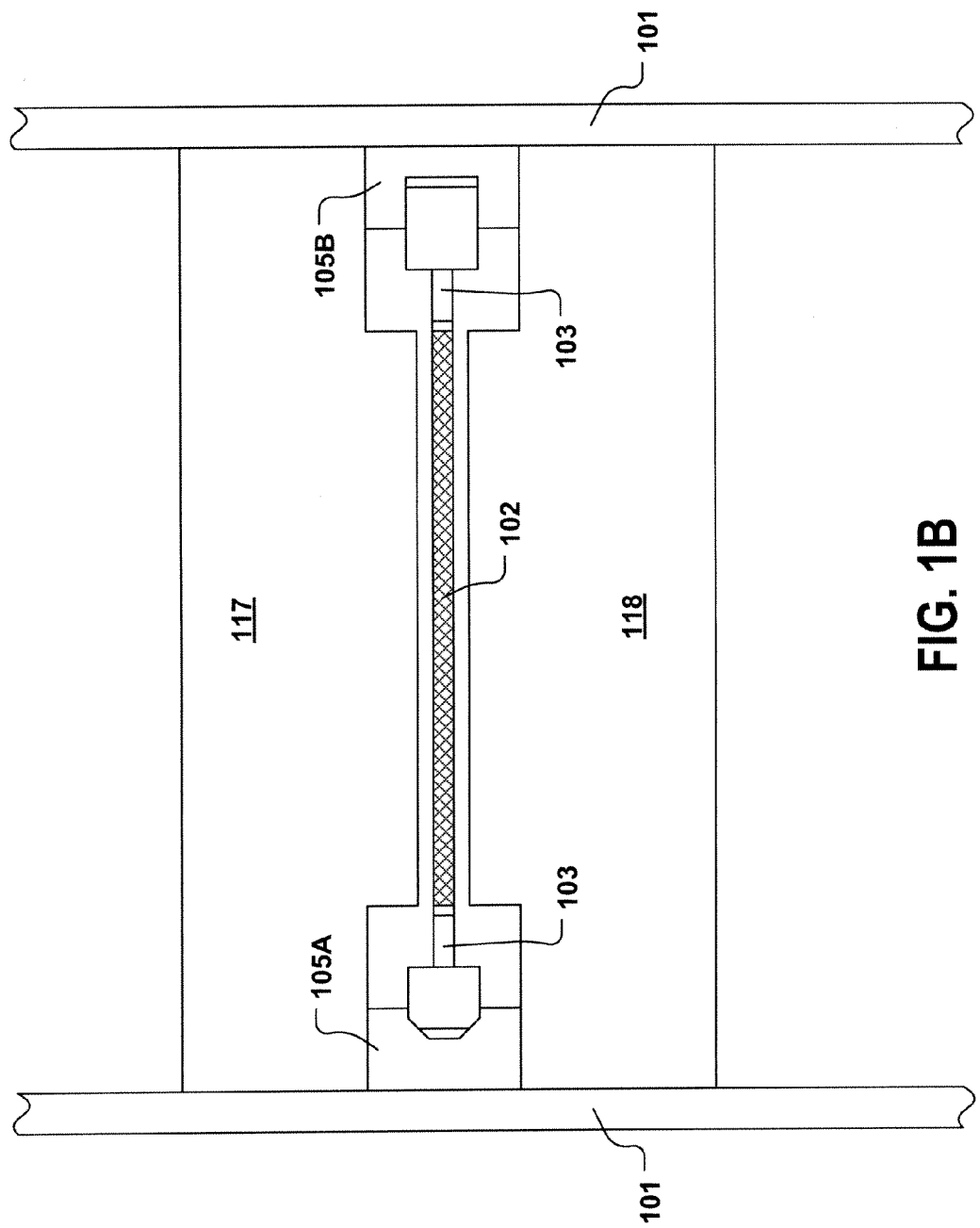

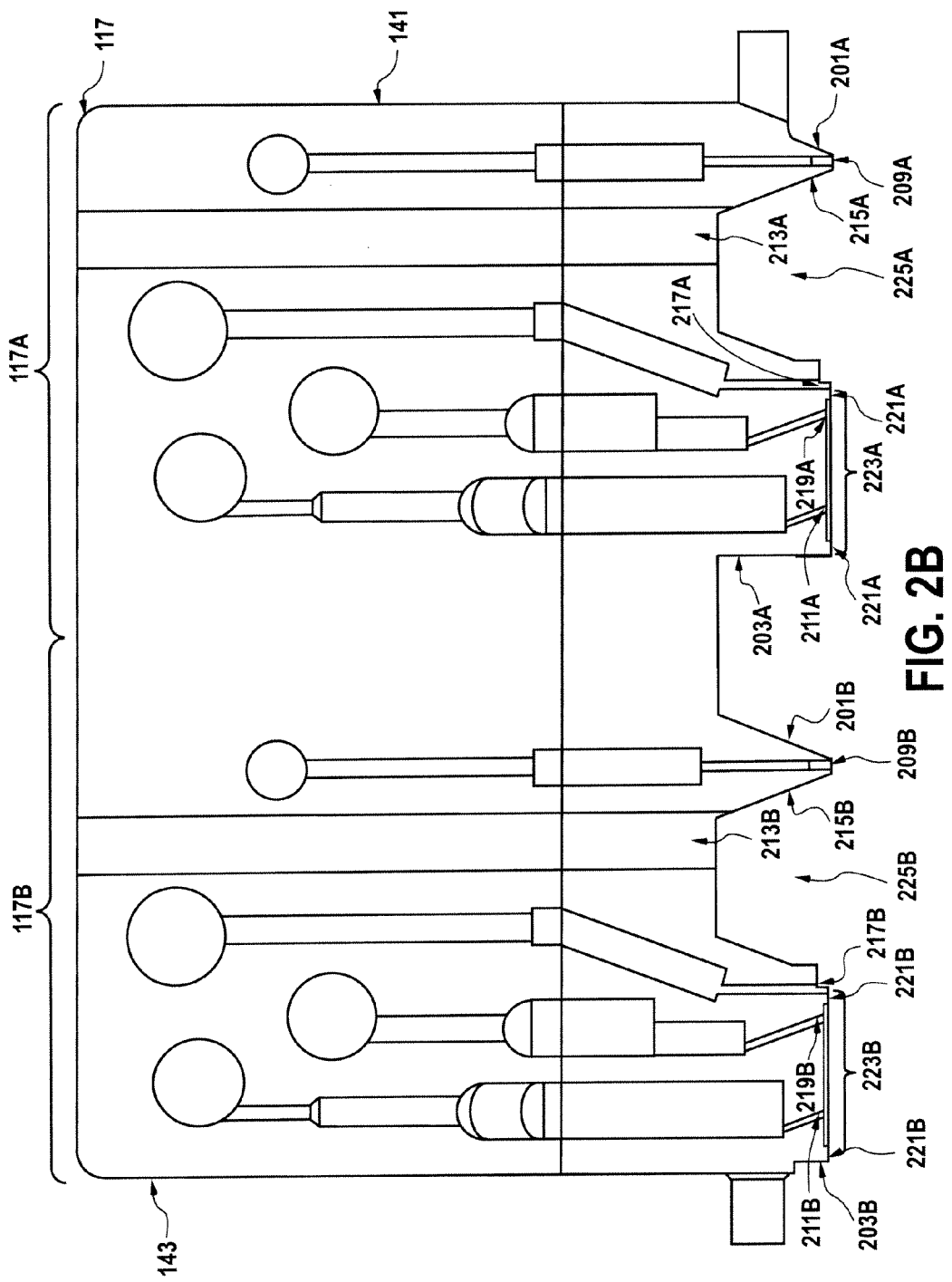

METHOD FOR SUBSTRATE CLEANING INCLUDING MOVEMENT OF SUBSTRATE BELOW SUBSTRATE CLEANING MODULE

CLAIM OF PRIORITY

This application is a continuation of prior application Ser. No. 12/431,731, filed on Apr. 28, 2009 now U.S. Pat. No. 7,849,554. The disclosure of the above-identified application is incorporated herein by reference in its entirety.

CROSS-REFERENCE TO RELATED APPLICATIONS

This application is related to the following U.S. Patent Applications:
- U.S. patent application Ser. No. 12/165,577, filed on Jun. 30, 2008, entitled "Single Substrate Processing Head for Particle Removal Using Low Viscosity Fluid,"
- U.S. patent application Ser. No. 12/131,654, filed on Jun. 2, 2008, entitled "Materials for Particle Removal by Single-Phase and Two-Phase Media,"
- U.S. patent application Ser. No. 12/131,660, filed on Jun. 2, 2008, entitled "Methods for Particle Removal by Single-Phase and Two-Phase Media,"
- U.S. patent application Ser. No. 12/131,667, filed on Jun. 2, 2008, entitled "Apparatus for Particle Removal by Single-Phase and Two-Phase Media,"
- U.S. patent application Ser. No. 11/532,491, filed on Sep. 15, 2006, entitled "Method and Material for Cleaning a Substrate,"
- U.S. patent application Ser. No. 11/532,493, filed on Sep. 15, 2006, entitled "Apparatus and System for Cleaning a Substrate," and
- U.S. patent application Ser. No. 11/641,362, filed on Dec. 18, 2006, entitled "Substrate Preparation Using Stabilized Fluid Solutions and Methods for Making Stable Fluid Solutions,"
- U.S. patent application Ser. No. 12/212,579, filed on Sep. 17, 2008, entitled "Method and Apparatus for Removing Contaminants from Substrate."

The disclosure of each above-identified related application is incorporated herein by reference.

BACKGROUND

In the fabrication of semiconductor devices such as integrated circuits, memory cells, and the like, a series of manufacturing operations are performed to define features on semiconductor wafers ("wafers"). The wafers (or substrates) include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contaminants from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

SUMMARY

In one embodiment, an upper processing head for cleaning a substrate is disclosed. The upper processing head includes a first module having a leading edge and a trailing edge. A top of a substrate to be cleaned is to pass below the first module in a direction extending from the leading edge to the trailing edge. The first module includes a row of cleaning material dispense ports defined along the leading edge. The row of cleaning material dispense ports is defined to dispense a layer of a cleaning material downward onto the substrate when present thereunder. The first module also includes a row of rinsing material dispense ports defined along the trailing edge. The row of rinsing material dispense ports is defined to dispense a rinsing material downward onto the substrate when present thereunder. The first module further includes a row of ventilation ports defined along a trailing side of the row of cleaning material dispense ports. Additionally, the first module includes a first row of vacuum ports defined between the row of ventilation ports and the row of rinsing material dispense ports. The first row of vacuum ports is defined to provide multi-phase suction of air supplied through the row of ventilation ports and of the cleaning material and the rinsing material from the substrate when present thereunder.

In another embodiment, a lower processing head for cleaning a substrate is disclosed. The lower processing head includes a first module having a leading edge and a trailing edge. A bottom of a substrate to be cleaned is to pass above the first module in a direction extending from the leading edge to the trailing edge. The first module includes a drain channel defined along the leading edge to collect and drain a material dispensed therein. The first module also includes a projected curb defined to circumscribe a rinsing meniscus region. The projected curb includes a leading portion and trailing portion respectively defined about a leading half and a trailing half of the rinsing meniscus region. The leading portion of the projected curb is located at a trailing side of the drain channel. The first module further includes a row of rinsing material dispense ports defined within the rinsing meniscus region along the trailing portion of the projected curb. The row of rinsing material dispense ports is defined to dispense a rinsing material upward onto the substrate when present thereabove. Additionally, the first module includes a row of vacuum ports defined to bisect a leading edge of the leading portion of the projected curb. The row of vacuum ports is defined to provide multi-phase suction of the rinsing material and air.

In another embodiment, a system for cleaning a substrate is disclosed. The system includes a substrate carrier defined to move a substrate in a substantially linear path while maintaining the substrate in a substantially horizontal orientation. The system also includes an upper processing head positioned above the path of the substrate. The upper processing head includes a first topside module defined to apply a cleaning material to the substrate and then expose the substrate to a topside rinsing meniscus. The first topside module is defined to flow a rinsing material through the topside rinsing meniscus in a substantially uni-directional manner towards the cleaning material and opposite a direction of movement of the substrate. The system further includes a lower processing head positioned below the path of the substrate. The lower processing head includes a first bottomside module defined to apply a bottomside rinsing meniscus to the substrate so as to balance a force applied to the substrate by the topside rinsing meniscus. The first bottomside module is defined to provide a drain channel for collecting and draining the cleaning material to be dispensed from the first topside module when the substrate carrier is not present between the upper and lower processing heads.

In another embodiment, a substrate cleaning module is disclosed. The substrate cleaning module includes a cleaning material dispense region defined along a leading edge of the substrate cleaning module to dispense a cleaning material downward toward a substrate when present below the substrate cleaning module. The substrate cleaning module also includes a rinsing meniscus generation region defined along a trailing edge of the substrate cleaning module to generate a meniscus of rinsing material between the substrate and the substrate cleaning module when the substrate is present below the substrate cleaning module.

In another embodiment, a substrate rinsing module is disclosed. The substrate rinsing module includes a drain channel defined along a leading edge of the substrate rinsing module. The substrate rinsing module also includes a rinsing meniscus generation region defined along a trailing edge of the substrate rinsing module to generate a meniscus of rinsing material between a bottom surface of a substrate and the substrate rinsing module when the substrate is present above the substrate rinsing module.

In another embodiment, a method is disclosed for substrate cleaning. The method includes an operation for moving a substrate to be cleaned below a substrate cleaning module in a direction extending from a leading edge to a trailing edge of the substrate cleaning module. The method also includes an operation for dispensing a cleaning material downward toward a top surface of the substrate along the leading edge of the substrate cleaning module, as the substrate is moved below the substrate cleaning module. The method further includes an operation for generating a rinsing meniscus along the trailing edge of the substrate cleaning module between the top surface of the substrate and the substrate cleaning module, as the substrate is moved below the substrate cleaning module.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 1B shows a vertical cross-section view of the chamber with the substrate carrier located beneath the upper processing head and above the lower processing head 118, in accordance with one embodiment of the present invention;

FIG. 2B shows a vertical cross-sectional view of the upper processing head as cut perpendicularly between its leading edge and its trailing edge, in accordance with one embodiment of the present invention;

DETAILED DESCRIPTION

In the following description, numerous specific details are se forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

A substrate, as referenced herein, denotes without limitation, semiconductor wafers, hard drive disks, optical discs, glass substrates, flat panel display surfaces, liquid crystal display surfaces, etc., which may become contaminated during manufacturing or handling operations. Depending on the actual substrate, a surface may become contaminated in different ways, and the acceptable level of contamination is defined in the particular industry in which the substrate is handled. For ease of discussion, substrate contamination is described herein by a presence of contaminant particles on the substrate surface. However, it should be understood that contaminant particles as referenced herein may take the form of essentially any type of contaminant that may contact a substrate during essentially any substrate processing and handling operation.

In various embodiments, the apparatuses, systems, and methods disclosed herein can be used for cleaning contaminant particles from patterned substrates and non-patterned substrates alike. In the case of patterned substrates, protruding structures on the patterned substrate surface to be cleaned may correspond to protruding lines, such as polysilicon lines or metal lines. Additionally, the patterned substrate surface to be cleaned may include recessed features, such as recessed vias resulting from a chemical mechanical planarization (CMP) process.

Figure 1A:
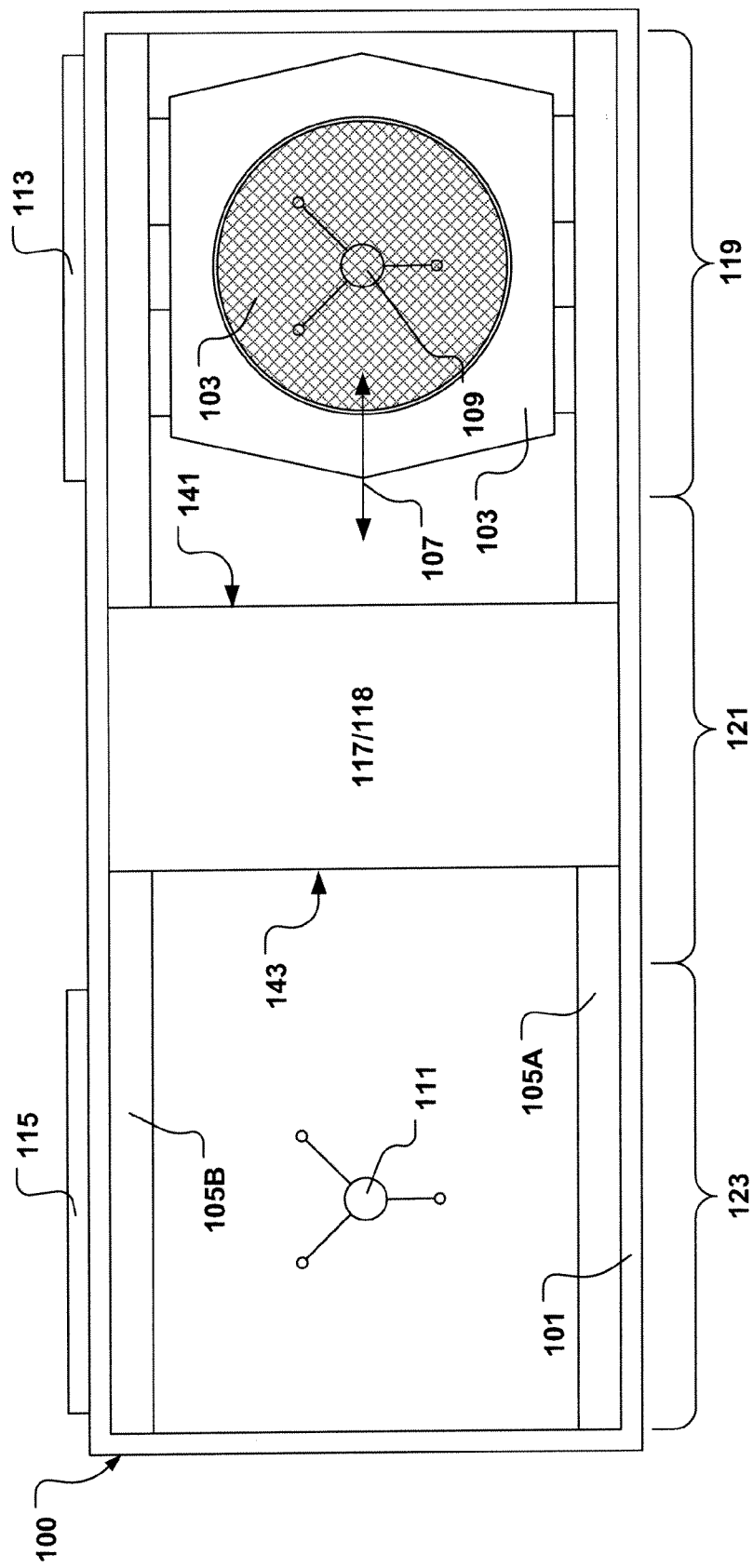
FIG. 1A shows a system for cleaning contaminants from a substrate, in accordance with one embodiment of the present invention.

FIG. 1A shows a system for cleaning contaminants from a substrate, in accordance with one embodiment of the present invention. The system includes a chamber 100 defined by enclosing walls 101. The chamber 100 includes an input module 119, a processing module 121, and an output module 123. A substrate carrier 103 and corresponding drive apparatus is defined to provide linear movement of a substrate 102 from the input module 119, through the processing module 121, to the output module 123, as indicated by arrow 107. A drive rail 105A and a guide rail 105B are defined to provide for controlled linear movement of the substrate carrier 103, such that the substrate 102 is maintained in a substantially horizontal orientation along a linear path defined by the drive rail 105A and guide rail 105B.

The input module 119 includes a door assembly 113 through which the substrate 102 can be inserted into the chamber 100 by a substrate handling device. The input module 119 also includes a substrate lifter 109 defined to move vertically through an open region of the substrate carrier 103, when the substrate carrier 103 is centered thereover in the input module 119. The substrate lifter 109 can be raised to receive the substrate 102 when inserted into the chamber 100 through the door assembly 113. The substrate lifter 109 can then be lowered to place the substrate 102 on the substrate carrier 103 and clear the linear travel path of the substrate carrier 103.

The processing module 121 includes an upper processing head 117 disposed to process a top surface of the substrate 102 as the substrate carrier 103, with the substrate 102 positioned thereon, moves beneath the upper processing head 217. The processing module 121 also includes a lower processing head 118 (see FIG. 1B) disposed below the linear travel path of the substrate carrier 103 opposite the upper processing head 117. The lower processing head 118 is defined and positioned to process a bottom surface of the substrate 102 as the substrate carrier 103 moves through the processing module 121. Each of the upper and lower processing heads 117 and 118 has a leading edge 141 and trailing edge 143, such that during a processing operation the substrate carrier 103 moves the substrate 102 along the linear path from the leading edge 141 toward the trailing edge 143. As discussed in more detail below, with regard to the present invention, each of upper and lower processing heads 117 and 118 are defined to perform a multi-stage cleaning process on the top and bottom surfaces of the substrate 102, respectively.

It should be understood that in some embodiments one or more additional processing heads may be used in conjunction with the upper processing head 117 above the linear travel path of the substrate carrier 103, and/or one or more additional processing heads may be used in conjunction with the lower processing head 118 below the linear travel path of the substrate carrier 103. For example, processing heads defined to perform a drying process on the substrate 102 may be positioned behind the trailing edges of the upper and lower processing heads 117 and 118, respectively.

Once the substrate carrier 103 moves through the processing module 121, the substrate carrier 103 arrives at the output module 115. The output module 115 includes a substrate lifter 111 defined to move vertically through the open region of the substrate carrier 103, when the substrate carrier 103 is centered thereover in the output module 111. The substrate lifter 111 can be raised to lift the substrate 102 from the substrate carrier 103 to a position for retrieval from the chamber 100. The output module 111 also includes a door assembly 115 through which the substrate 102 can be retrieved from the chamber 100 by a substrate handling device. Once the substrate 102 is retrieved off of the substrate lifter 111, the substrate lifter 111 can be lowered to clear the linear travel path of the substrate carrier 103. Then, the substrate carrier 103 is moved back to the input module 119 to retrieve the next substrate for processing.

FIG. 1B shows a vertical cross-section view of the chamber 100 with the substrate carrier 103 located beneath the upper processing head 117 and above the lower processing head 118, in accordance with one embodiment of the present invention. The upper processing head 117 is mounted to both the drive rail 105 and the guide rail 105, such that a vertical position of the upper processing head 117 is indexed to both a vertical position of the drive rail 105 and a vertical position of the guide rail 105, and is thereby indexed to a vertical position of the substrate carrier 103 and substrate 102 held thereon.

The upper processing head 117 is defined to perform a cleaning process on the top surface of the substrate 102 as the substrate carrier 103 moves the substrate 102 thereunder. Similarly, the lower processing head 118 is defined to perform a rinsing process on the bottom surface of the substrate 102 as the substrate carrier 103 moves the substrate 102 thereover. In various embodiments, each of the upper and lower processing heads 117 and 118 within the processing module 121 can be defined to perform one or multiple substrate processing operations on the substrate 102. Additionally, in one embodiment, the upper and lower processing heads 117 and 118 within the processing module 121 are defined to span a diameter of the substrate 102, such that one pass of the substrate carrier 103 under/over the upper/lower processing heads 117/118 will process an entirety of the top/bottom surface of the substrate 102.

Figure 2A:
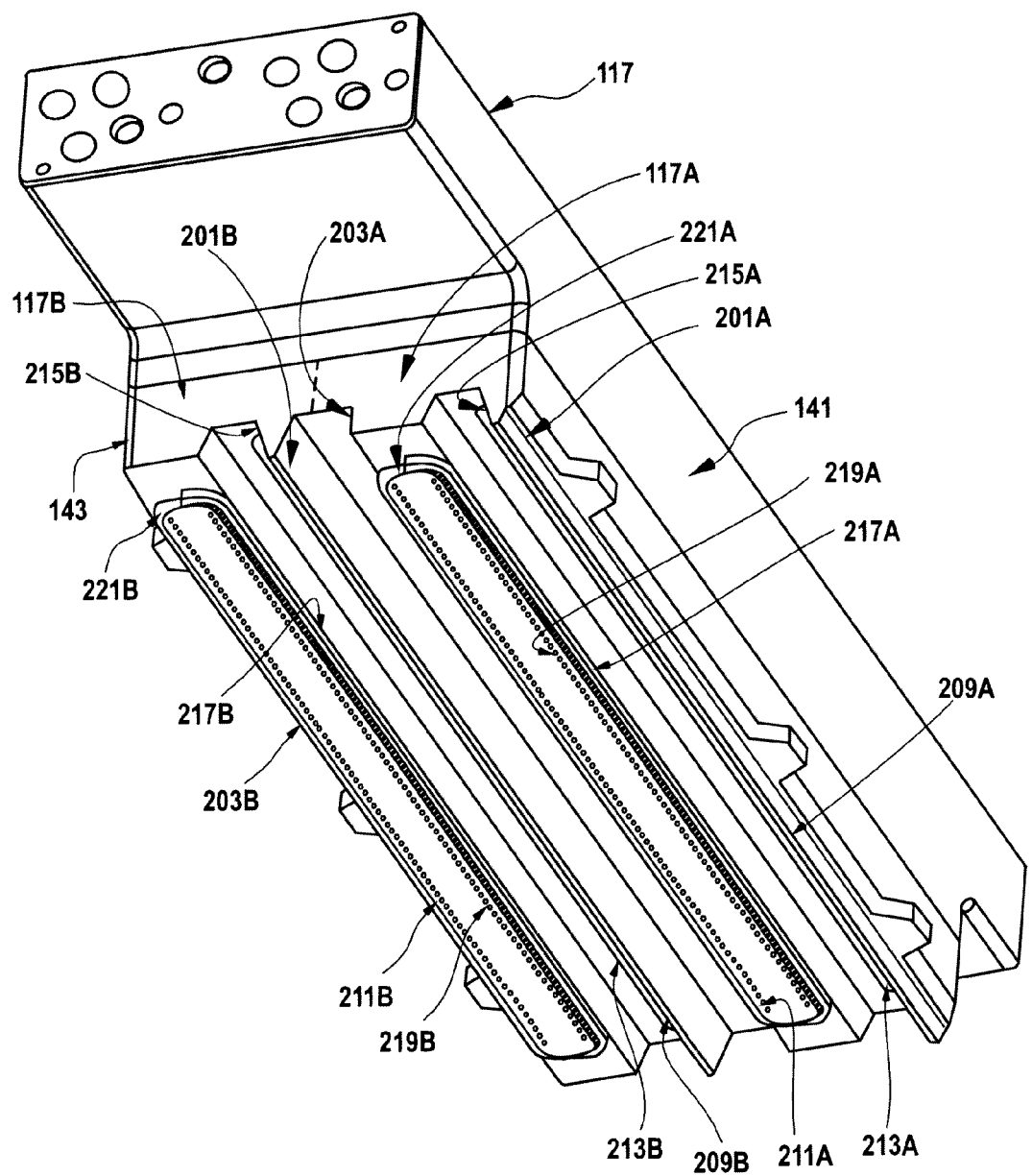
FIG. 2A shows an isometric view of the upper processing head, in accordance with one embodiment of the present invention.

FIG. 2A shows an isometric view of the upper processing head 117, in accordance with one embodiment of the present invention. The upper processing head 117 includes two essentially identical modules, namely a first topside module 117A and a second topside module 117B. The first topside module 117A has an effective leading edge 201A and an effective trailing edge 203A. The second topside module 117B has an effective leading edge 201B and an effective trailing edge 203B. A top of the substrate to be cleaned is to pass sequentially below the first and second topside modules 117A and 117B in a direction extending from the leading edge 141 to the trailing edge 143 of the upper processing head 117. Therefore, during processing, the substrate passes below the first topside module 117A in a direction extending from the effective leading edge 201A to the effective trailing edge 203A. Then, the substrate passes below the second topside module 117B in a direction extending from the effective leading edge 201B to the effective trailing edge 203B.

In one embodiment, the second topside module 117B is defined essentially identical to the first topside module 117A. The second topside module 117B is contiguous with the first topside module 117A in the upper processing head 117A, such that the effective leading edge 201B of the second topside module 117B is positioned behind the effective trailing edge 203A of the first topside module 117A relative to the substrate direction of travel beneath the upper processing head 117 during processing operation. Also, in one embodiment, the first and second topside modules 117A/117B are independently controllable. However, in another embodiment, the first and second topside modules 117A/117B can be commonly controlled.

FIG. 2B shows a vertical cross-sectional view of the upper processing head 117, as cut perpendicularly between its leading edge 141 and its trailing edge 143, in accordance with one embodiment of the present invention. Various features of the upper processing head 117 as discussed herein can be referenced to both of FIGS. 2A and 2B. The upper processing head 117 can be defined from essentially any type of material, e.g., plastic, metal, etc., that is compatible with the semiconductor wafer cleaning process and chemicals used therein, and that is capable of being formed into the configuration disclosed herein.

The first topside module 117A includes a row of cleaning material dispense ports 209A defined along the effective leading edge 201A. The second topside module 117B also includes a row of cleaning material dispense ports 209B defined along the effective leading edge 201B. Each row of cleaning material dispense ports 209A/209B is defined to dispense a layer of a cleaning material downward onto the substrate when present thereunder. The cleaning material dispense ports 209A/209B are connected to respective cleaning material supply flow networks, such as described in co-pending U.S. patent application Ser. No. 12/165,577, which is incorporated herein in its entirety. The cleaning material dispense ports 209A/209B and their associated cleaning material supply flow networks are configured to minimize a form factor of the upper processing head 117, while ensuring that the substrate passing beneath the cleaning material dispense ports 209A/209B will be coated by the cleaning material in a substantially uniform manner.

In one embodiment, the cleaning material dispense ports 209A/209B are defined as a row of discrete ports, e.g., holes. In another embodiment, the cleaning material dispense ports 209A/209B are defined as one or more slots extending in a length of the upper processing head 117. In one embodiment, the cleaning material dispense ports 209A/209B are defined to provide for substantially uniform and complete coverage of the substrate at a substrate carrier speed of up to about 60 millimeters per second (mm/sec), with a correspondingly low cleaning material consumption of about 25 milliliters per substrate (mL/substrate). Also, the cleaning material dispense ports 209A/209B and their associated cleaning material supply flow networks can be operated with many different cleaning materials having varying chemical properties.

In one embodiment, the cleaning material referenced herein can include one or more viscoelastic materials for entrapping contaminants present on the surface of the substrate. In one example embodiment, the viscoelastic material is defined by polymers of large molecular weight. In another example embodiment, the cleaning material is a gel-like polymer. In yet another example embodiment, the cleaning material is a sol, i.e., a colloidal suspension of solid particles in a liquid. In yet another embodiment, the cleaning material is a liquid solution. Contaminant particles on the substrate become entrapped within viscoelastic component chains/network of the cleaning material. Contaminant particles entrapped within the cleaning material are removed from the substrate when the cleaning material is removed from the substrate by way of rinsing. Some example cleaning materials suitable for use with the system disclosed herein are described in co-pending U.S. patent application Ser. No. 12/131,654, which is incorporated herein in its entirety.

The first topside module 117A includes a row of rinsing material dispense ports 211A defined along the effective trailing edge 203A. The second topside module 117A also includes a row of rinsing material dispense ports 211B defined along the effective trailing edge 203B. Each row of rinsing material dispense ports 211A/211B is defined to dispense a rinsing material downward onto the substrate when present thereunder. In one embodiment, each port in the row of rinsing material dispense ports 211A/211B is defined to have a diameter of about 0.03 inch, and adjacent ports in the row of rinsing material dispense ports 211A/211B are separated by a center-to-center distance of about 0.125 inch. However, it should be understood that in other embodiments, the row of rinsing material dispense ports 211A/211B can be defined to have a different size and spacing, so long as the rinsing material is dispensed therefrom in a suitable manner. Also, in one embodiment, the row of rinsing material dispense ports 211A/211B can be defined as one or more slots extending in a line along the effective trailing edge 203A/203B of the first/second topside module 117A/117B.

In one embodiment, the row of rinsing material dispense ports 211A/211B and their associated rinsing material supply flow network are defined to dispense rinsing material at a flow rate within a range extending from about 1 liter per minute (L/min) to about 4 L/min. Also, the rinsing material dispense ports 211A/21B and their associated rinsing material supply flow networks can be operated with many different rinsing materials having varying chemical properties. The rinsing material should be chemically compatible with the cleaning material and with the substrate to be cleaned. In one embodiment, the rinsing material is deionized water (DIW). However, in other embodiments, the rinsing material can be one of many different materials in liquid state, such as dimethyl sulfoxide (DMSO), dimethyl formamide (DMF), dimethyl acetate (DMAC), a polar solvent easy mixable with DIW, an atomized liquid such as an atomized polar solvent (e.g., DIW), or any combination thereof. It should be understood that the above-identified rinsing materials are provided by way of example and do not represent an inclusive set of rinsing materials.

As discussed further below, a rinsing meniscus is respectively formed between each of the first and second topside modules 117A and 117B and the substrate. In each of the first and second topside modules 117A/117B, the row of rinsing material dispense ports 211A/211B supplies rinsing material on the trailing side of the rinsing meniscus, while a first row of vacuum ports 217A/217B removes fluid on the leading side of the rinsing meniscus. Because the first row of vacuum ports 217A/217B is provided at the leading side of the rinsing meniscus, as opposed to being provided at both the leading and trailing sides, ports within the row of rinsing fluid supply ports 211A/211B are angled downward toward the first row of vacuum ports 217A/217B. More specifically, each port in the row of rinsing material dispense ports 211A/211B is defined to angle downward in a direction extending from the effective trailing edge 203A/203B toward the effective leading edge 201A/201B.

Due to the angle of the rinsing material dispense ports 211A/211B, the rinsing material is dispensed with sufficient hydraulic momentum to overcome a drag force introduced by the substrate movement toward the effective trailing edge 203A/203B, thereby allowing the rinsing material to be pushed through the rinsing fluid meniscus to the row of vacuum ports 217A/217B on the leading side of the rinsing meniscus. Additionally, it should be appreciated that the angle of the ports in the row of rinsing material dispense ports 211A/211B is defined to reduce a pressure of rinsing material at the effective trailing edge 203A/203B so as to assist with confinement of a bulk of the rinsing material meniscus. In one embodiment, an angle between a centerline of each port in the row of rinsing material dispense ports 211A/211B and a plumb vector is within a range extending up to about 45 degrees. In one particular embodiment, an angle between a centerline of each port in the row of rinsing material dispense ports 211A/211B and a plumb vector is about 20 degrees.

The first topside module 117A includes a first row of vacuum ports 217A defined between the row of ventilation ports 213A and the row of rinsing material dispense ports 211A. The second topside module 117B includes a first row of vacuum ports 217B defined between the row of ventilation ports 213B and the row of rinsing material dispense ports 211B. In each of the first and second topside modules 117A/117B, the first row of vacuum ports 217A/217B is disposed to substantially bisect a total separation distance between the effective leading edge 201A/201B and the effective trailing edge 203A/203B, respectively.

Each first row of vacuum ports 217A/217B is defined to provide multi-phase suction of the cleaning material and the rinsing material from the substrate when present thereunder, and of air supplied through the row of ventilation ports 213A/213B. In one embodiment, in each of the first and second topside modules 117A/117B, the first row of vacuum ports 217A/217B and their associated vacuum supply networks are defined to provide a fluid suction flow rate within a range extending from about 250 standard liters per minute (SLM) to about 550 SLM. It should be understood that the suction force provided through the first row of vacuum ports 217A/217B is limited to a suction force that will not cause the substrate to be sucked against the upper processing head 117.

It should be understood that with a fixed total suction flow, or with a fixed total cross-sectional area for suction flow, a lower vacuum port size limit exists where the cleaning material can plug the vacuum port and destabilize an interface between the rinsing material, cleaning material, and air. It should also be understood that with a fixed total suction flow, or with a fixed total cross-sectional area for suction flow, an upper vacuum port size limit exists where the cleaning material can leak between the vacuum ports because of insufficient suction flow between the vacuum ports. The vacuum ports should be sized small enough to enable reduction in a spacing between adjacent vacuum ports so as to avoid cleaning material leakage between the vacuum ports, but not so small as to allow plugging of the vacuum ports by the cleaning material.

In one embodiment, each port in the first row of vacuum ports 217A/217B is defined to have a diameter of about 0.04 inch, and adjacent ports in the first row of vacuum ports 217A/217B are separated by a center-to-center distance of about 0.0625 inch. In another embodiment, each port in the first row of vacuum ports 217A/217B is defined to have a diameter of about 0.06 inch, and adjacent ports in the first row of vacuum ports 217A/217B are separated by a center-to-center distance of about 0.125 inch. However, it should be understood that in other embodiments, the first row of vacuum ports 217A/217B can be defined to have a different size and spacing than the particular embodiments mentioned herein, on long as the suction force provided thereby is suitable for the requirements of the upper processing head 117 operation. Also, in one embodiment, the first row of vacuum ports 217A/217B can be defined as one or more slots.

The first topside module 117A includes a projected curb 221A defined to circumscribe a rinsing meniscus region 223A between the first row of vacuum ports 217A and the effective trailing edge 203A, such that the projected curb 221A includes a leading portion and trailing portion respectively defined about a leading half and a trailing half of the rinsing meniscus region 223A. The second topside module 117B includes a projected curb 221B defined to circumscribe a rinsing meniscus region 223B between the first row of vacuum ports 217B and the effective trailing edge 203B, such that the projected curb 221B includes a leading portion and trailing portion respectively defined about a leading half and a trailing half of the rinsing meniscus region 223B.

In each of the first and second topside modules 117A/117B, the first row of vacuum ports 217A/217B is defined to bisect a leading edge of the leading portion of the projected curb 221A/221B. A trailing edge of the trailing portion of the projected curb 221A/221B is the effective trailing edge 203A/203B of the first and second topside modules 117A/117B. Also, in each of the first and second topside modules 117A/117B, the row of rinsing material dispense ports 211A/211B is defined within the rinsing meniscus region 223A/223B near the trailing portion of the projected curb 221A/221B.

The trailing portion of the projected curb 221A/221B is defined to provide physical confinement of a bulk of a meniscus of the rinsing material to be present within the rinsing meniscus region 223A/223B. Also, the trailing portion of the projected curb 221A/221B is defined to leave a uniform thin layer of the rinsing material on the substrate when the substrate emerges from beneath the first and second topside modules 117A/117B. The trailing portion of the projected curb 221A/221B provides a local increase in hydraulic resistance and serves to hold majority of the rinsing material meniscus inside the rinsing meniscus ion 223A/223B.

In one embodiment, the projected curb 221A/221B projects about 0.02 inch downward from a horizontal surface of the upper processing head 117 within the rinsing meniscus region 223A/223B. However, it should be understood that in other embodiments, the projected curb 221A/221B can project a different distance from the horizontal surface of the upper processing head 117 within the rinsing meniscus region 223A/223B, so long as the rinsing meniscus is confined and so long as the respective flow behavior of the rinsing material and cleaning material is suitable to ensure a substantially complete rinsing of the cleaning material from the substrate.

The first topside module 117A includes a row of ventilation ports 213A defined along a trailing side 215A of the row of cleaning material dispense ports 209A. The second topside module 117B also includes a row of ventilation ports 213B defined along a trailing side 215B of the row of cleaning material dispense ports 209B. Each of the first and second topside modules 117A/117B includes a respective plenum region 225A/225B defined between the row of cleaning material dispense ports 209A/209B and the first row of vacuum ports 217A/217B. In each of the first and second topside modules 117A/117B, the row of ventilation ports 213A/213B is connected in fluid communication to the plenum region 225A/225B. In each of the first and second topside modules 117A/117B, each plenum region 225A/225B is defined to facilitate air flow from the row of ventilation ports 213A/213B to the first row of vacuum ports 217A/217B without air-flow-induced disturbance of the cleaning material to be disposed on the substrate by the row of cleaning material dispense ports 209A/209B. Each row of ventilation ports 213A and 213B is defined to provide substantially uniform ventilation air flow into the plenum regions 225A and 225B, respectively, along the length of the projected curbs 221A and 221B, respectively.

Confinement of the rinsing meniscus within each of the rinsing meniscus regions 223A and 223B depends upon sufficient air entrainment within the fluid flow through each of the first rows of vacuum ports 217A and 217B, respectively. In each of the first and second topside modules 117A/117B, the row of ventilation ports 213A/213B is defined to provide sufficient air flow in the plenum region 225A/225B so that sufficient air is available for entrainment within the fluid flow through the first row of vacuum ports 217A/217B. The volume of the plenum region 225A/225B is defined to provide sufficient air volume for flow through the first row of vacuum ports 217A/217B while avoiding adverse air flow effects on the cleaning material layer present on the substrate within the plenum region 225A/225B. For example, one such adverse air flow effect could be a drag force of air upon the cleaning material layer which would cause the cleaning material layer to be spread thinner or develop ripples. Therefore, the row of ventilation ports 213A/213B and corresponding plenum region 225A/225B are defined and optimized to sustain the cleaning process performance without adversely impacting the cleaning material coating aspect of the cleaning process. In one embodiment, a vertical cross-sectional area of each plenum region 225A and 225B, as cut in a direction extending perpendicularly between the leading edge 141 and trailing edge 143 of the upper processing head 117, is about 0.35 square inch.

In one embodiment, each of the first and second topside modules 117A/117B includes a second row of vacuum ports 219A/219B defined along a trailing side of the first row of vacuum ports 217A/217B. The second row of vacuum ports 219A/219B is defined to provide multi-phase suction of the cleaning material and the rinsing material from the substrate when present thereunder. The second row of vacuum ports 219A/219B can be controlled independently from the first row of vacuum ports 217A/217B. The ports of the second row of vacuum ports 219A/219B are defined as single phase liquid return ports and are configured to avoid disruption of the rinsing fluid meniscus stability.

The second row of vacuum ports 219A/219B provides for fine-tuning of the cleaning process. The second row of vacuum ports 219A/219B provides for additional control of the liquid velocity force distribution along an interface between the rinsing and cleaning materials. In the event that cleaning material leaks past the first row of vacuum ports 217A/217B, the second row of vacuum ports 219A/219B is capable of removing the leaked cleaning material, thereby providing a backup rinsing capability and preventing additional mixing or dilution of the cleaning material with the rinsing fluid within the rinsing fluid meniscus region 223A/223B. Also, operation of the second row of vacuum ports 219A/219B may allow for an increase in substrate carrier speed, thereby increasing throughput and broadening the cleaning process window.

In one embodiment, the ports in the second row of vacuum ports 219A/219B are sized similar to the ports within the row of rinsing material dispense ports 211A/211B. In one embodiment, each port in the second row of vacuum ports 219A/219B is defined to have a diameter of about 0.03 inch, and adjacent ports in the second row of vacuum ports 219A/219B are separated by a center-to-center distance of about 0.125 inch. Additionally, the ports in the second row of vacuum ports 219A/219B are angled downward against the substrate movement direction in a manner similar to that of the ports in the row of rinsing material dispense ports 211A/211B. This angling of the ports in the second row of vacuum ports 219A/219B provides sufficient spacing between the second row of vacuum ports 219A/219B and the row of rinsing material dispense ports 211A/211B to ensure that the rinsing material can uniformly disperse across the substrate within the rinsing meniscus region 223A/223B prior to encountering the suction force of the second row of vacuum ports 219A/219B.

Figure 3A:
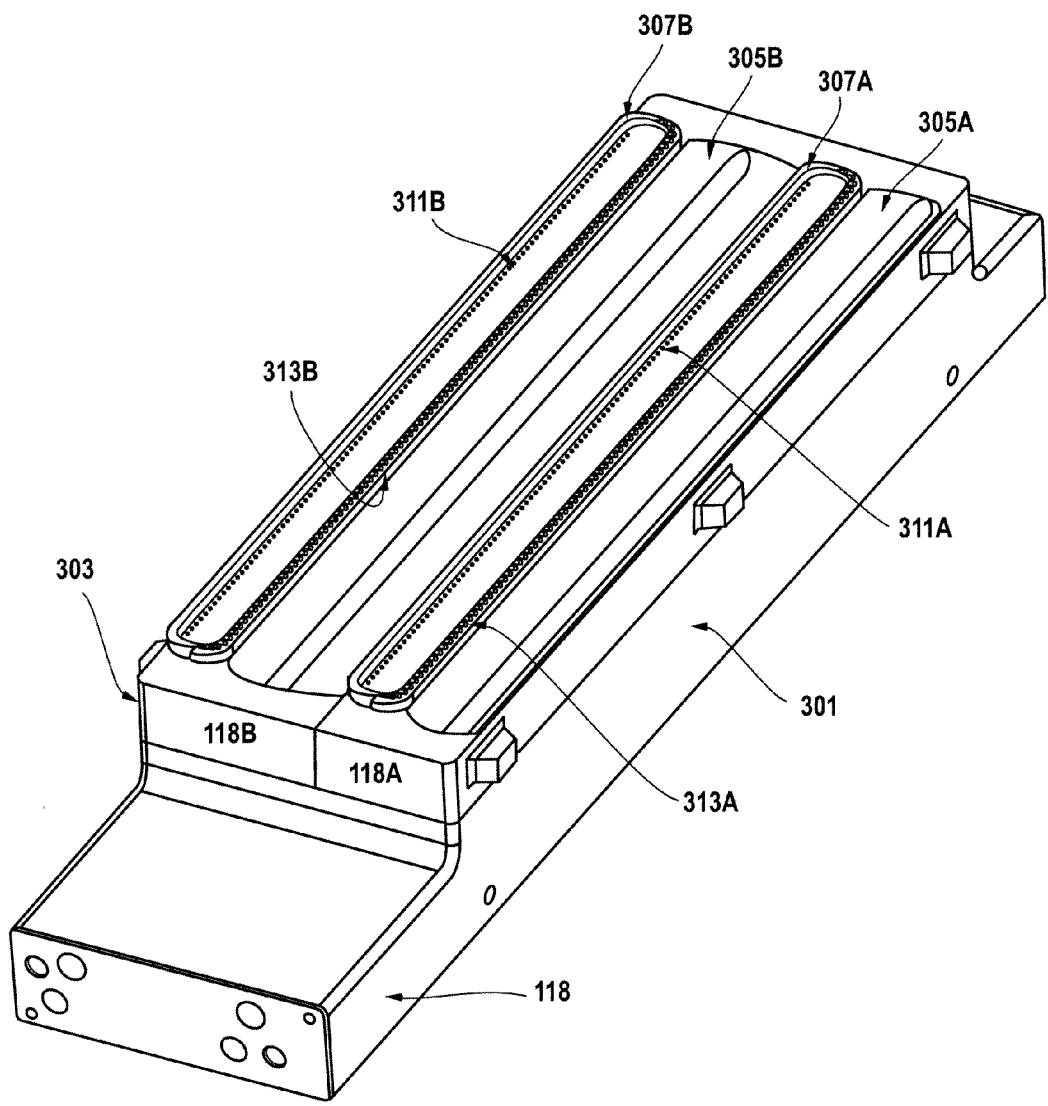
FIG. 3A shows an isometric view of the lower processing head, in accordance with one embodiment of the present invention.

FIG. 3A shows an isometric view of the lower processing head 118, in accordance with one embodiment of the present invention. The lower processing head 118 includes two identical modules, namely a first bottomside module 118A and a second bottomside module 118B. The lower processing head 118 has a leading edge 301 and a trailing edge 303. A bottom of the substrate to be cleaned is to pass sequentially above the first and second bottomside modules 118A and 118B in a direction extending from the leading edge 301 to the trailing edge 303. The second bottomside module 118B is defined similar to the first bottomside module 118A. In one embodiment, the first and second bottomside modules 118A/118B are independently controllable. However, in another embodiment, the first and second bottomside modules 118A/118B can be commonly controlled.

Figure 3B:
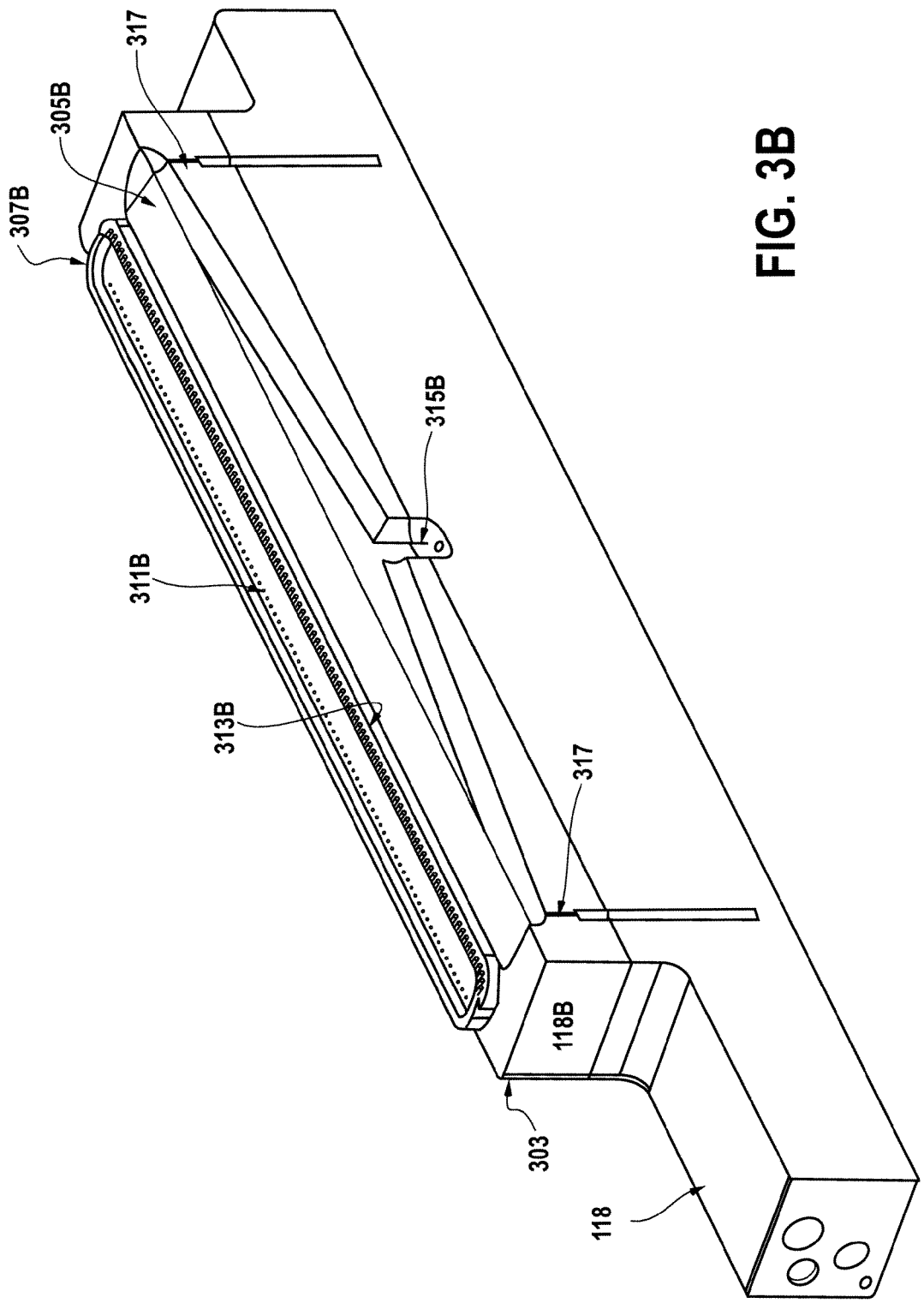
FIG. 3B shows an isometric view of a vertical cross-section of the lower processing head as cut lengthwise through the second bottomside module, in accordance with one embodiment of the present invention.
Figure 3C:
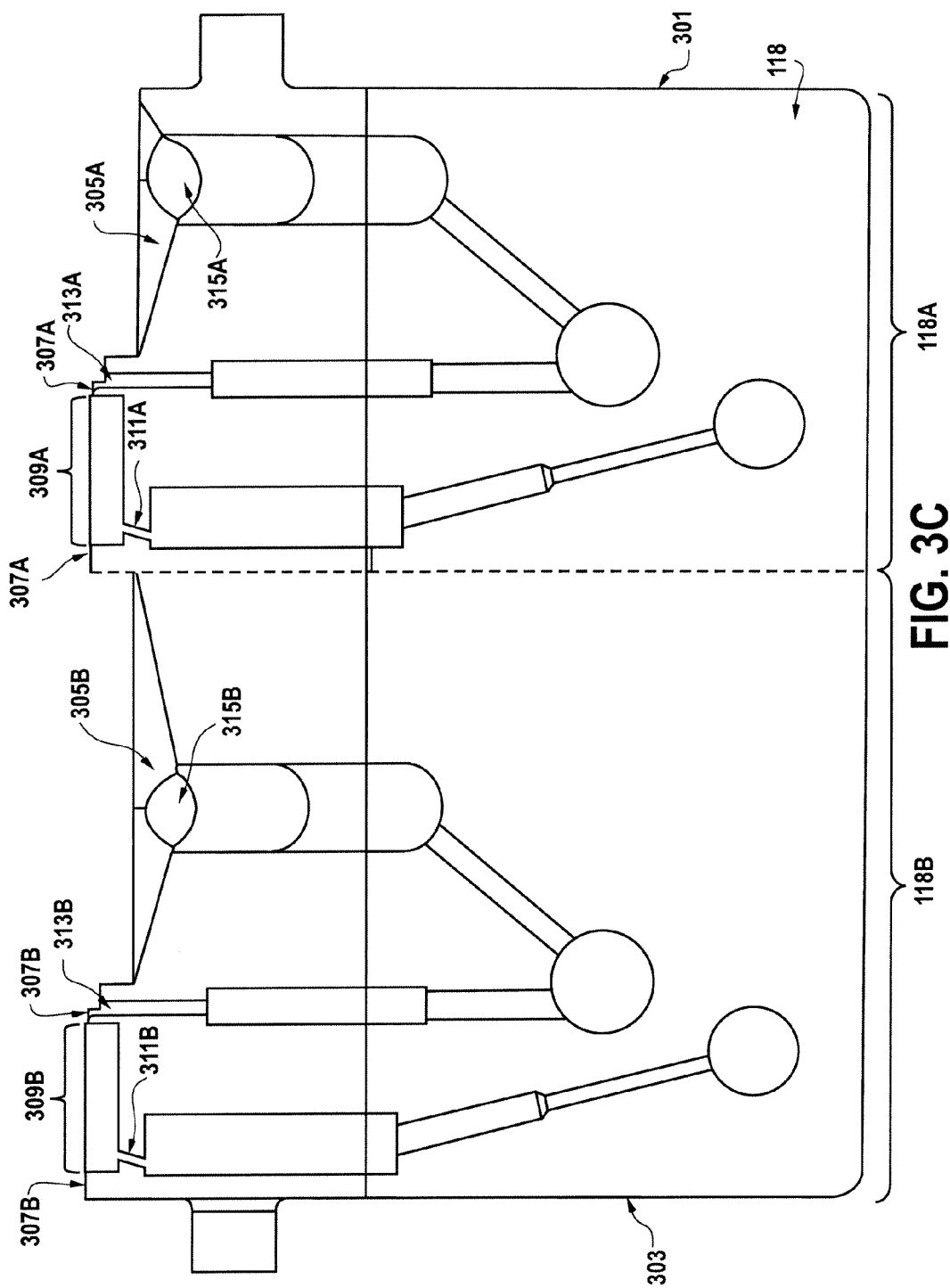
FIG. 3C shows a vertical cross-section view of the lower processing head as cut perpendicularly between its leading edge and its trailing edge, in accordance with one embodiment of the present invention.

FIG. 3B shows an isometric view of a vertical cross-section of the lower processing head 118, as cut lengthwise through the second bottomside module 118B, in accordance with one embodiment of the present invention. FIG. 3C shows a vertical cross-section view of the lower processing head 118, as cut perpendicularly between its leading edge 301 and its trailing edge 303, in accordance with one embodiment of the present invention. Various features of the lower processing head 118 as discussed herein can be referenced to each of FIGS. 3A, 3B, and 3C. The lower processing head 118 can be defined from essentially any type of material, e.g., plastic, metal, etc., that is compatible with the semiconductor wafer cleaning process and chemicals used therein, and that is capable of being formed into the configuration disclosed herein.

Each of the first and second bottomside modules 118A and 118B includes a respective drain channel 305A and 305B defined along the length of the lower processing head 118 to collect and drain a material dispensed therein. As shown in FIG. 3B, each drain channel 305A/305B is sloped downward from each outer end of the lower processing head 118 toward a location near a center of the drain channel 305A/305B at which a respective drain port 315A/315B is defined. FIG. 3B also shows liquid supply ports 317 defined at high points within each drain channel 305A/305B to flow liquid, e.g., deionized water (DIW), down the drain channel 305A/305B to facilitate movement of material dispensed within the drain channel 305A/305B toward the drain port 315A/315B and to prevent splattering of cleaning material upon impact with the drain channel 305A/305B.

Each of the first and second bottomside modules 118A and 118B includes a projected curb 307A and 307B, respectively, defined to circumscribe a rinsing meniscus region 309A and 309B, respectively. Each projected curb 307A/307B includes a leading portion and trailing portion respectively defined about a leading half and a trailing half of the rinsing meniscus region 309A/309B. The leading portion of each projected curb 307A and 307B is located at a trailing side of the drain channels 305A and 305B, respectively. The trailing portion of each projected curb 307A/307B is defined to provide physical confinement of a bulk of a meniscus of the rinsing material to be present within the respective rinsing meniscus region 309A/309B. The rinsing meniscus regions 309A/309B of the lower processing head 118 are defined to ensure that the bottom surface of the substrate remains wet during the cleaning process. This serves to prevent premature drying of excess cleaning material that may reach the bottom surface of the substrate.

Each of the first and second bottomside modules 118A/118B includes a respective row of rinsing material dispense ports 311A/311B defined within the respective rinsing meniscus region 309A/309B along the trailing portion of the respective projected curb 307A/307B. Each row of rinsing material dispense ports 311A/311B is defined to dispense a rinsing material upward onto the substrate when present thereabove. Each port in each row of rinsing material dispense ports 311A/311B is defined to angle upward in a direction extending from the trailing edge 303 toward the leading edge 301. In one embodiment, an angle between a centerline of each port in each row of rinsing material dispense ports 311A/311B and a plumb vector is within orange extending up to about 45 degrees. In another embodiment, the angle between a centerline of each port in each row of rinsing material dispense ports 311A/311B and a plumb vector is about 20 degrees.

Each of the first and second bottomside modules 118A/118B includes a respective row of vacuum ports 313A/313B defined to bisect a leading edge of the leading portion of the respective projected curb 307A/307B. Each row of vacuum ports 313A/313B is defined to provide multi-phase suction of the rinsing material and air. The lower processing head 118 is defined to mirror the upper processing head 117 in form factor and hydraulic force applied to the substrate as either liquid flow or vacuum suction. More specifically, the rinsing meniscus regions 309A/309B of the lower processing head 118 are essentially the same as the rinsing meniscus regions 223A/223B of the upper processing head 117, with minor differences in the configurations of the vacuum ports (313A/313B versus 217A/217B) and depth.

Each row of vacuum ports 313A/313B of the lower processing head 118 may have a different port size and port pitch as compared to the ports within the first row of vacuum ports 217A/217B of the upper processing head 117. It should be appreciated that the configuration of the rows of vacuum ports 313A/313B of the lower processing head 118 do not significantly influence contaminant particle removal from the top surface of the substrate. In one embodiment, the depth of the rinsing meniscus regions 309A/309B within the lower processing head 118 is larger than that of the rinsing meniscus regions 223A/223B within upper processing head 117, thereby reducing a hydraulic force exerted upon the bottom of the substrate by the rinsing material dispensed from the respective row of rinsing material dispense ports 311A/311B.

By operating the lower processing head 118 to balance the hydraulic forces applied to the substrate by the upper processing head 117, the lower processing head 118 facilitates stable cleaning process performance. Also, when the substrate carrier with substrate thereon is not present between the upper and lower processing heads 117/118, the lower processing head 118 works in conjunction with the upper processing head 117 to provide sustained, confined, and stable head-to-head rinsing material meniscuses within the rinsing meniscus regions 223A/309A and 223B/309B. Also, when the substrate carrier with substrate thereon is not present between the upper and lower processing heads 117/118, the sloped drain channels 305A/305B of the lower processing head 118 receive the cleaning material dispensed from the row of cleaning material dispense ports 209A/209B of the upper processing head 117.

Figure 4:
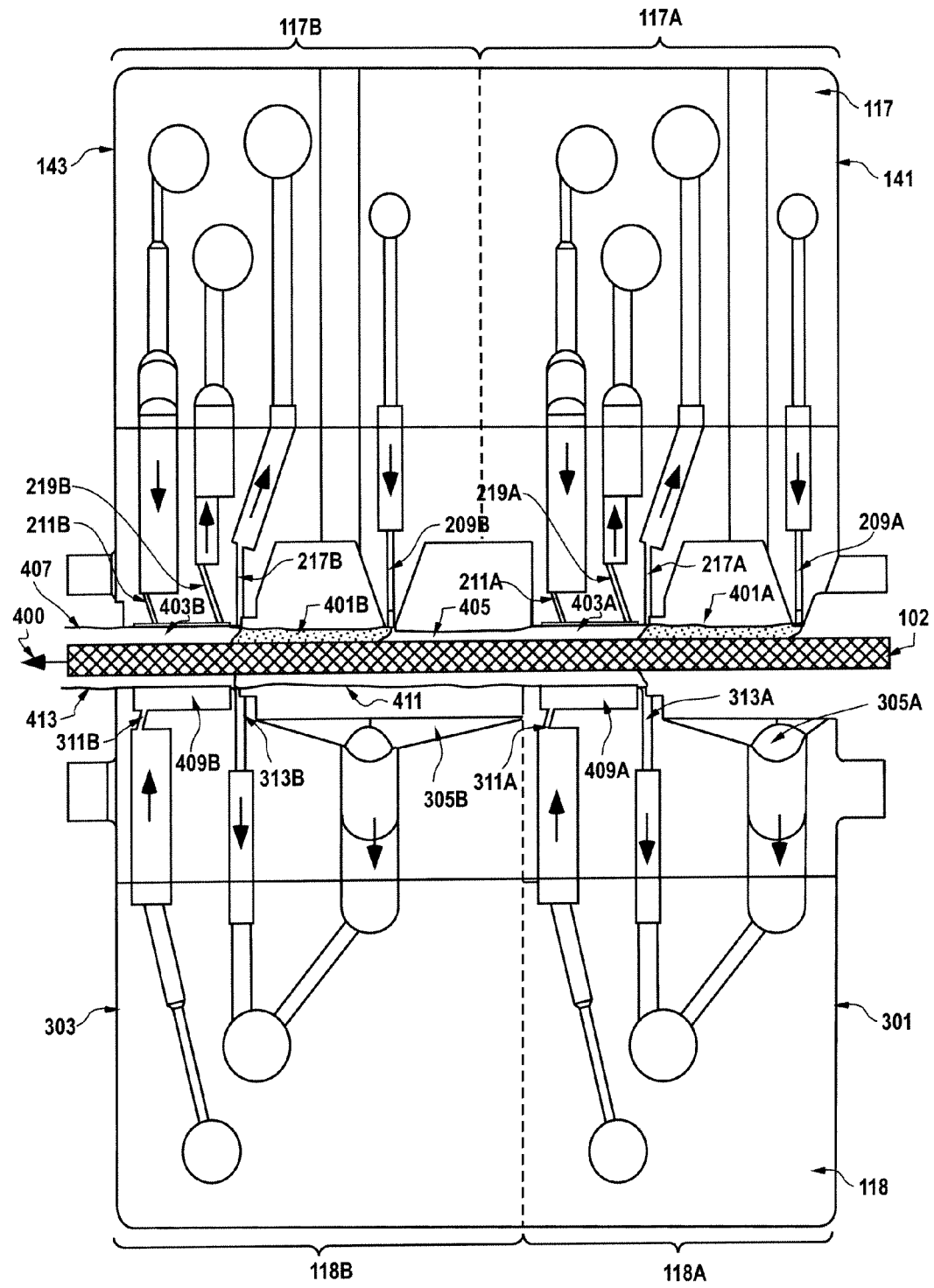
FIG. 4 shows the upper processing head positioned above the substrate with the lower processing head positioned below the substrate opposite the upper processing head, in accordance with one embodiment of the present invention.

FIG. 4 shows the upper processing head 117 positioned above the substrate 102 with the lower processing head 118 positioned below the substrate 102 opposite the upper processing head 117, in accordance with one embodiment of the present invention. The first topside module 117A of the upper processing head 117 operates to apply the cleaning material 401A to the substrate 102, and then expose the substrate 102 to a topside rinsing meniscus 403A. The first topside module 117A operates to flow the rinsing material through the topside rinsing meniscus 403A in a substantially uni-directional manner towards the cleaning material 401A and opposite a direction 400 of movement of the substrate 102. A flow rate of rinsing material through the topside rinsing meniscus 403A is set to prevent cleaning material leakage past the topside rinsing meniscus 403A. The first topside module 117A leaves a uniform thin film of rinsing material 405 on the substrate 102.

The second topside module 117B of the upper processing head 117 operates to apply cleaning material 401B to the substrate 102, and then expose the substrate 102 to a topside rinsing meniscus 403B. The second topside module 117B operates to flow the rinsing material through the topside rinsing meniscus 403B in a substantially uni-directional manner towards the cleaning material 401B and opposite the direction 400 of movement of the substrate 102. A flow rate of rinsing material through the topside rinsing meniscus 403B is set to prevent cleaning material leakage past the topside rinsing meniscus 403B. The second topside module 117B leaves a uniform thin film of rinsing material 407 on the substrate 102.

The first bottomside module 118A of the lower processing head 118 operates to apply a bottomside rinsing meniscus 409A to the substrate 102 so as to balance a force applied to the substrate 102 by the topside rinsing meniscus 403A. The first bottomside module 117B operates to flow the rinsing material through the bottomside rinsing meniscus 409A in a substantially uni-directional manner opposite the direction 400 of movement of the substrate 102. The first bottomside module 117B leaves a uniform thin film of rinsing material 411 on the substrate 102.

The second bottomside module 118B of the lower processing head 118 operates to apply a bottomside rinsing meniscus 409B to the substrate 102 so as to balance a force applied to the substrate 102 by the topside rinsing meniscus 403B. The second bottomside module 118B operates to flow the rinsing material through the bottomside rinsing meniscus 409B in a substantially uni-directional manner opposite the direction 400 of movement of the substrate 102. The second bottomside module 118B leaves a uniform thin film of rinsing material 413 on the substrate 102.

Based on the opposing arrangement of the upper and lower processing heads 117 and 118, it should be appreciated that when the substrate 102 is not present, the cleaning material dispensed from each row of cleaning material dispense ports 209A/209B will be collected into respective drain channels 305A/305B of the lower processing head 118. Thus, a curtain of cleaning material can be produced prior to entrance of the substrate 102 between the upper and lower processing heads 117/118.

Additionally, based on the opposing arrangement of the upper and lower processing heads 117 and 118, it should be appreciated that each row of vacuum ports 313A/313B of the lower processing head 118 respectively complements each of the first rows of vacuum ports 217A/217B of the upper processing head 117 in suction force, thereby providing for removal of the rinsing material dispensed by both the upper and lower processing heads 117/118 when the substrate 102 is not present between the upper and lower processing heads 117/118. Also, the opposing arrangement of the rows of vacuum ports 313A and 313B of the lower processing head 118 to the first rows of vacuum ports 217A and 217B, respectively, of the upper processing head 117 prevents the substrate 102 from being sucked against either the upper or lower processing heads 117/118.

Each of the first and second topside modules 117A/117B of the upper processing head 117 can be operated independently. Also, each of the second rows of vacuum ports 219A/219B of the first and second topside modules 117A/117B can be operated independently. Also, each of the first and second bottomside modules 118A/118B of the lower processing head 118 can be operated independently. The foregoing allows for the following modes of operation:

Mode 1: First topside module 117A on with second row of vacuum ports 219 off, second topside module 117B off, first bottomside module 118A on, and second bottomside module 118B off.

Mode 2: First topside module 117A on with second row of vacuum ports 219 on, second topside module 117B off, first bottomside module 118A on, and second bottomside module 118B off.

Mode 3: First topside module 117A on with second row of vacuum ports 219 off, second topside module 117B on, first bottomside module 118A on, and second bottomside module 118B on.

Mode 4: First topside module 117A on with second row of vacuum ports 219 on, second topside module 117B on, first bottomside module 118A on, and second bottomside module 118B on.

The upper processing head 117 and lower processing head 118 cleaning system disclosed herein provides for improved particle removal efficiency (PRE) at higher substrate throughput, with low consumption of cleaning material. The cleaning system provides for an optimized pressure distribution at the leading edge of each rinsing meniscus to enable single-side vacuum suction at each rinsing meniscus, thereby increasing localized suction force to improve PRE without loss of rinsing meniscus containment. Also, leakage of cleaning material past the leading edge vacuum ports at each of the topside rinsing meniscuses is reduced by increasing the effective rinse and suction forces at the leading edge vacuum ports without requiring additional total flow or suction force.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for substrate cleaning, comprising:
moving a substrate to be cleaned below a substrate cleaning module in a direction extending from a leading edge to a trailing edge of the substrate cleaning module;
dispensing a cleaning material downward toward a top surface of the substrate from a row of cleaning material dispense ports defined along the leading edge of the substrate cleaning module as the substrate is moved below the substrate cleaning module; and
dispensing a rinsing material downward toward the top surface of the substrate from a row of rinsing material dispense ports defined along the trailing edge of the substrate cleaning module to generate a rinsing meniscus along the trailing edge of the substrate cleaning module between the top surface of the substrate and the substrate cleaning module as the substrate is moved below the substrate cleaning module;
applying vacuum suction through a row of vacuum ports at a vacuum location along a bottom surface of the substrate cleaning module and parallel to the leading and trailing edges of the substrate cleaning module, the row of vacuum ports defined between the row of rinsing material dispense ports and a row of ventilation ports; and
venting a plenum region through the row of ventilation ports, the plenum region located within the substrate cleaning module between the row of cleaning material dispense ports and the row of vacuum ports along a trailing side of a dispense location of the cleaning material.

2. The method as recited in claim 1, wherein the row of cleaning material dispense ports is formed in the bottom surface of the substrate cleaning module.

3. The method as recited in claim 1, wherein dispensing the rinsing material includes directing a flow of the rinsing material through the rinsing meniscus in a direction extending from a trailing half of the rinsing meniscus toward a leading half of the rinsing meniscus, and suctioning the rinsing meniscus along the leading half of the rinsing meniscus at the vacuum location.

4. The method as recited in claim 3, wherein venting of the plenum region is performed in a manner to enhance suctioning of the rinsing meniscus along the leading half of the rinsing meniscus.

5. The method as recited in claim 4, wherein the row of ventilation ports is defined along a trailing edge of the plenum region.

6. The method as recited in claim 1, further comprising:
repeating a combination of dispensing the cleaning material and dispensing the rinsing material in a sequential manner as the substrate is moved below the substrate cleaning module.

7. The method as recited in claim 1, further comprising:
moving the substrate over a substrate rinsing module as the substrate is moved below the substrate cleaning module in the direction extending from the leading edge to the trailing edge of the substrate cleaning module;
providing a drain channel along a leading edge of the substrate rinsing module; and
generating a lower rinsing meniscus along a trailing edge of the substrate rinsing module between a bottom surface of the substrate and the substrate rinsing module as the substrate is moved over the substrate rinsing module.

8. The method as recited in claim 7, further comprising:
flowing a liquid through the drain channel to facilitate movement of material collected within the drain channel toward a drain port within the drain channel.

9. The method as recited in claim 7, wherein generating the lower rinsing meniscus includes directing a flow of rinsing material through the lower rinsing meniscus in a direction extending from a trailing half of the lower rinsing meniscus toward a leading half of the lower rinsing meniscus, and suctioning the lower rinsing meniscus along the leading half of the lower rinsing meniscus.

10. The method as recited in claim 7, further comprising:
repeating a combination of providing the drain channel and generating the lower rinsing meniscus in a sequential manner as the substrate is moved over the substrate rinsing module.

11. The method as recited in claim 1, further comprising:
providing multi-phase suction through the row of vacuum ports, the multi-phase suction including suction of the cleaning material and of the rinsing material and of air supplied through the row of ventilation ports.

12. The method as recited in claim 1, further comprising:
controlling air flow from the row of ventilation ports to the row of vacuum ports so as to avoid air-flow-induced disturbance of the cleaning material present on the substrate below the plenum region.

13. The method as recited in claim 1, wherein the row of vacuum ports at the vacuum location is a first row of vacuum ports, and wherein the method includes:
applying a second vacuum suction through a second row of vacuum ports defined along a trailing side of the first row of vacuum ports.

14. The method as recited in claim 13, further comprising:
independently controlling the first and second rows of vacuum ports.

15. The method as recited in claim 1, further comprising:
providing physical confinement of a bulk of the rinsing meniscus.

16. The method as recited in claim 1, wherein the vacuum location substantially bisects a separation distance between the leading and trailing edges of the substrate cleaning module.

* * * * *